(12) United States Patent
Beaupre et al.

(10) Patent No.: US 8,310,040 B2
(45) Date of Patent: Nov. 13, 2012

(54) SEMICONDUCTOR DEVICE PACKAGE HAVING HIGH BREAKDOWN VOLTAGE AND LOW PARASITIC INDUCTANCE AND METHOD OF MANUFACTURING THEREOF

(75) Inventors: Richard Alfred Beaupre, Pittsfield, MA (US); Paul Alan McConnelee, Albany, NY (US); Arun Virupaksha Gowda, Rexford, NY (US); Thomas Bert Gorczyca, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 9 days.

(21) Appl. No.: 12/962,761

(22) Filed: Dec. 8, 2010

(65) Prior Publication Data
US 2012/0146234 A1 Jun. 14, 2012

(51) Int. Cl.
*H01L 23/48* (2006.01)
(52) U.S. Cl. ... 257/690; 257/774; 257/790; 257/E23.02; 257/E33.066
(58) Field of Classification Search .............. 257/E33.07
See application file for complete search history.

(56) References Cited

U.S. PATENT DOCUMENTS

| | | | |
|---|---|---|---|
| 5,161,093 A | 11/1992 | Gorczyca et al. | |
| 6,232,151 B1 | 5/2001 | Ozmat et al. | |
| 6,239,980 B1 | 5/2001 | Fillion et al. | |
| 6,306,680 B1 | 10/2001 | Fillion et al. | |
| 6,376,908 B1 * | 4/2002 | Gaku et al. | 257/707 |
| 7,262,444 B2 | 8/2007 | Fillion et al. | |
| 8,018,068 B1 * | 9/2011 | Scanlan et al. | 257/774 |
| 2001/0022404 A1 * | 9/2001 | Yamamoto et al. | 257/783 |
| 2003/0166314 A1 * | 9/2003 | Ono et al. | 438/125 |
| 2010/0320490 A1 * | 12/2010 | Lin et al. | 257/98 |

* cited by examiner

*Primary Examiner* — Stephen W Smoot
(74) *Attorney, Agent, or Firm* — Ziolkowski Patent Solutions Group, SC; Jean K. Testa

(57) ABSTRACT

A semiconductor device package includes a semiconductor device having connection pads formed thereon, with the connection pads being formed on first and second surfaces of the semiconductor device with edges of the semiconductor device extending therebetween. A first passivation layer is applied on the semiconductor device and a base dielectric laminate is affixed to the first surface of the semiconductor device that has a thickness greater than that of the first passivation layer. A second passivation layer having a thickness greater than that of the first passivation layer is applied over the first passivation layer and the semiconductor device to cover the second surface and the edges of the semiconductor device, and metal interconnects are coupled to the connection pads, with the metal interconnects extending through vias formed through the first and second passivation layers and the base dielectric laminate sheet to form a connection with the connection pads.

11 Claims, 10 Drawing Sheets

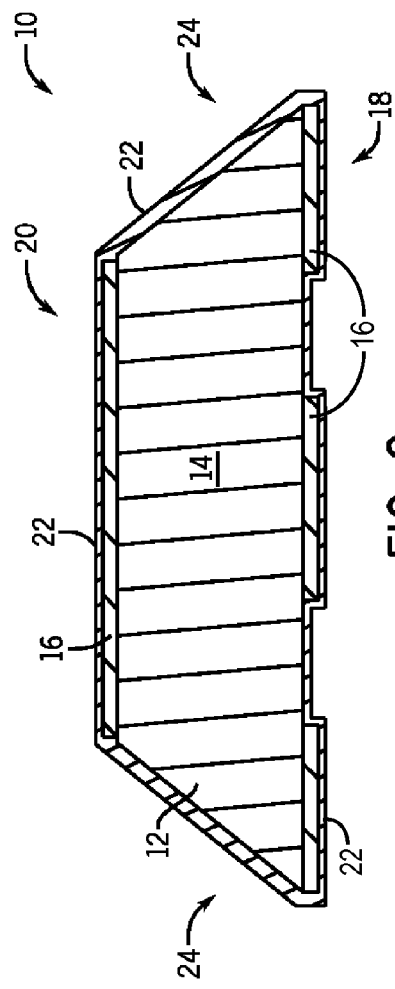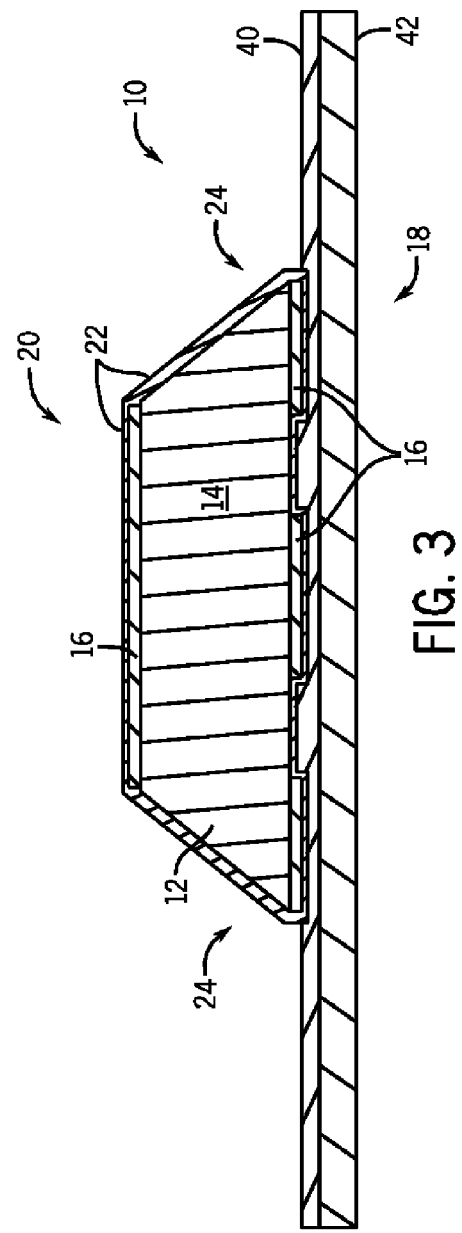

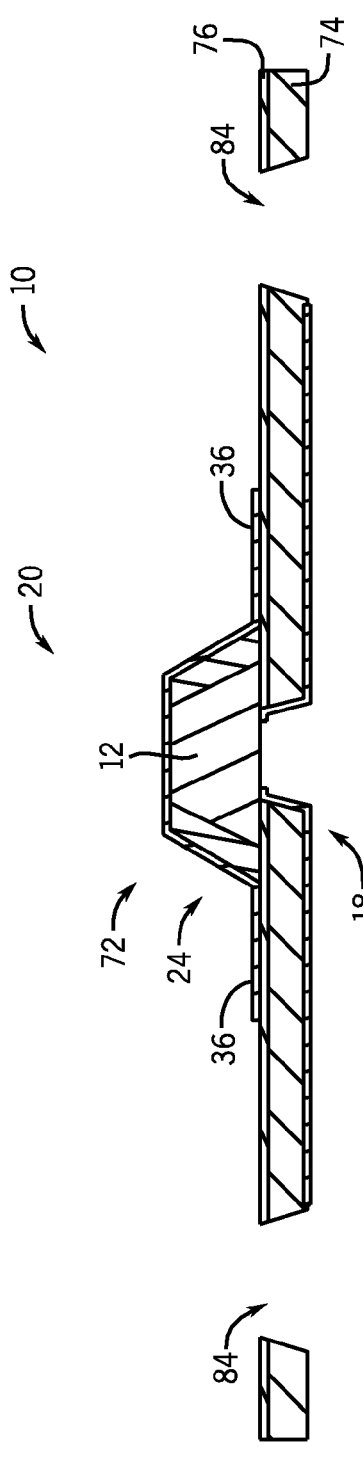
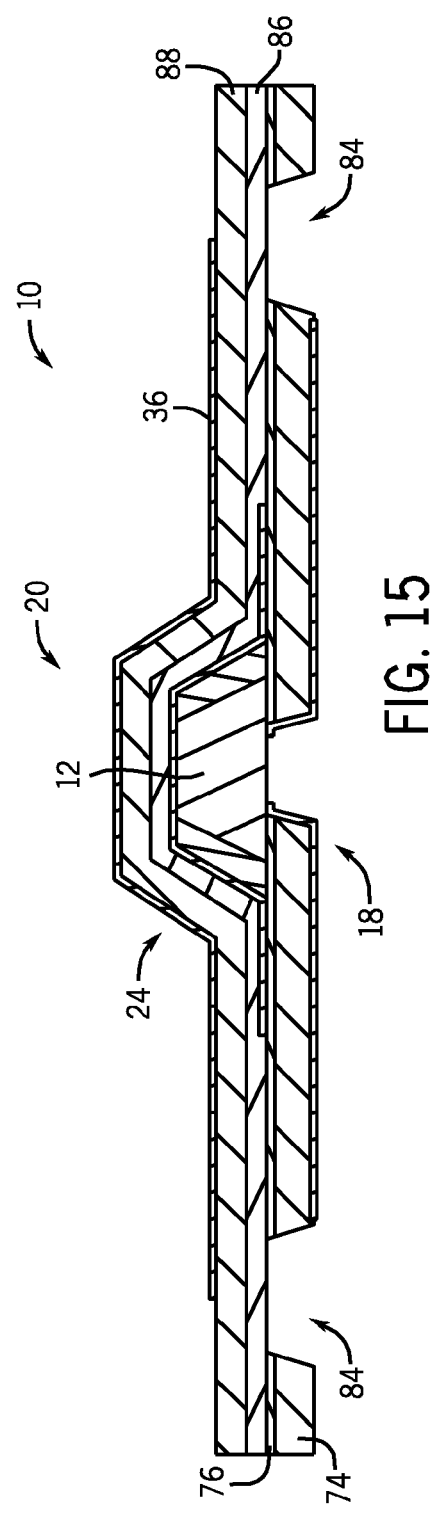

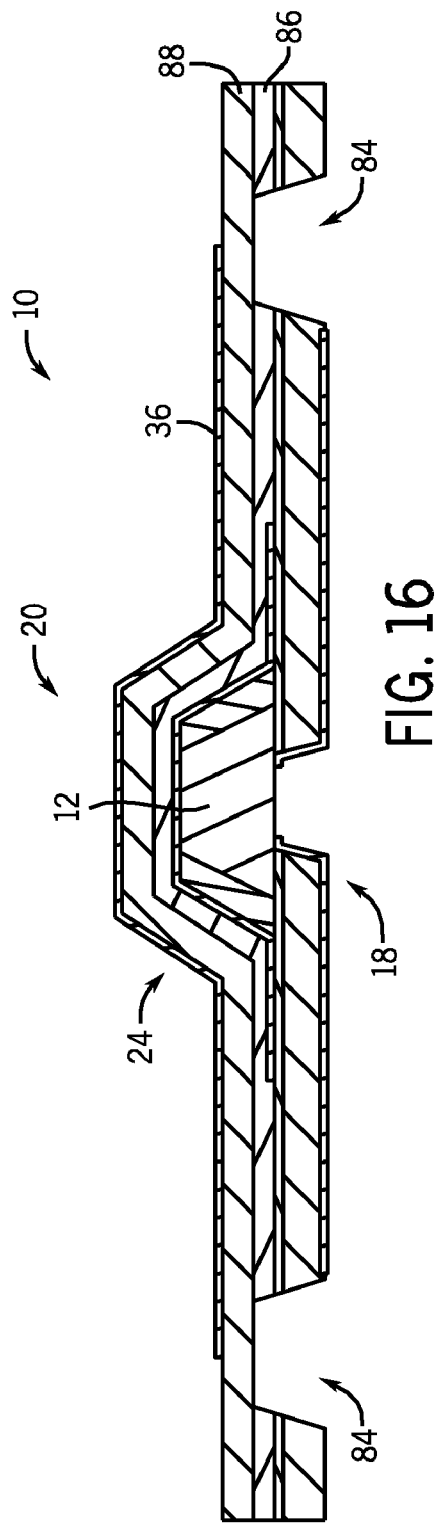
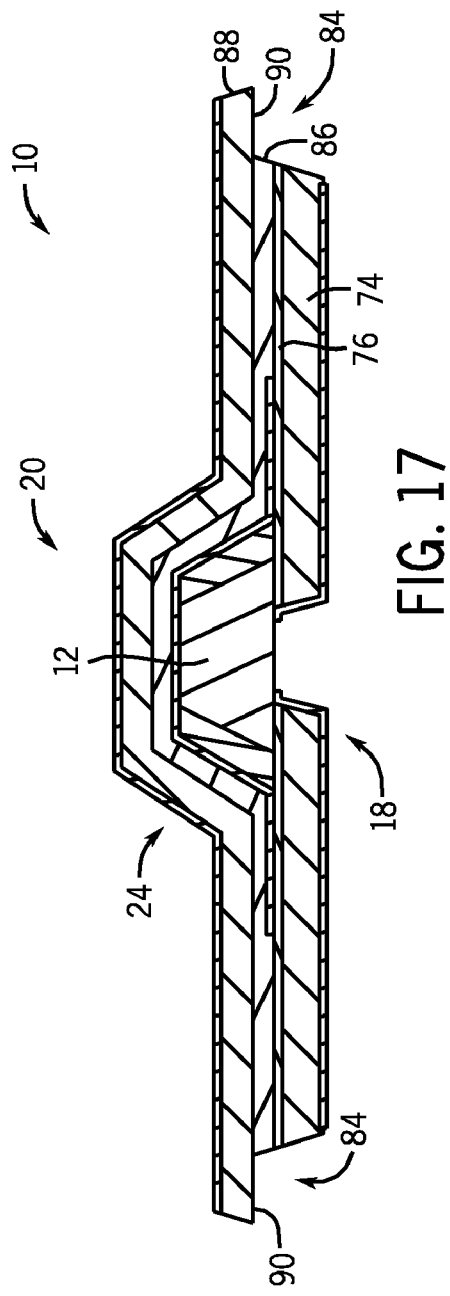

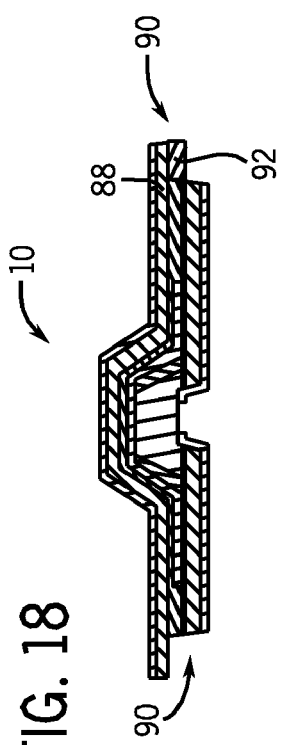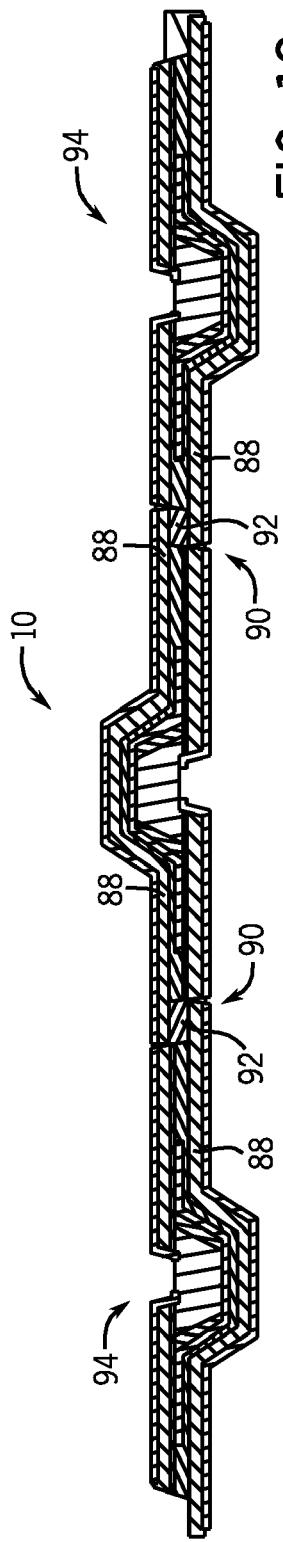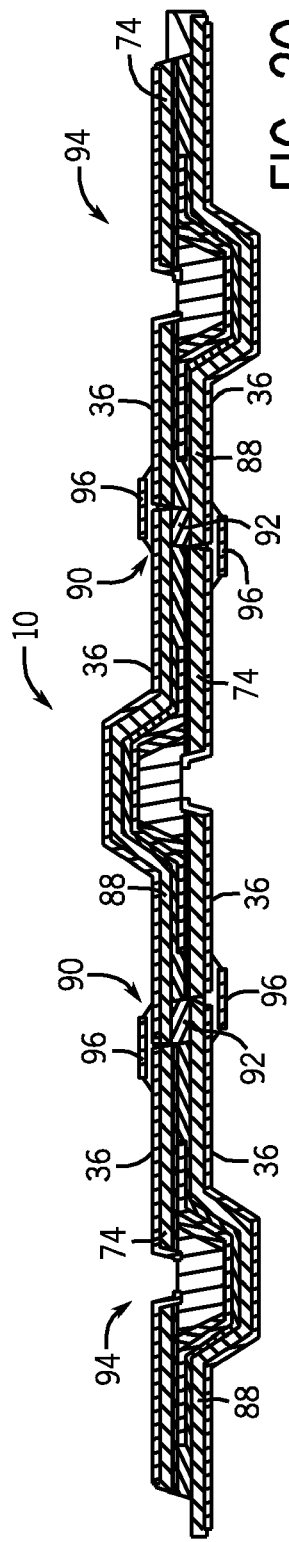

SEMICONDUCTOR DEVICE PACKAGE HAVING HIGH BREAKDOWN VOLTAGE AND LOW PARASITIC INDUCTANCE AND METHOD OF MANUFACTURING THEREOF

BACKGROUND OF THE INVENTION

Embodiments of the invention relate generally to structures and methods for packaging semiconductor devices and, more particularly, to a semiconductor device package structure that provides a high breakdown voltage and low parasitic inductance.

Power semiconductor devices are semiconductor devices used as switches or rectifiers in power electronic circuits, such as switched mode power supplies, for example. Most power semiconductor devices are only used in commutation mode (i.e., they are either on or off), and are therefore optimized for this. One common power semiconductor device is a high voltage power semiconductor diode. A high voltage power semiconductor diode operates on similar principles to its low-power counterpart, but is able to carry a larger amount of current and typically is able to support a larger reverse-bias voltage in the off-state. In use, high voltage power semiconductor diodes are connected to an external circuit by way of a power overlay (POL) packaging and interconnect system, with the POL package also providing a way to remove the heat generated by the diode and protect the diode from the external environment.

In order to operate efficiently, semiconductor diodes require dielectric isolation between their anode and cathode junction as well as a low loop inductance between the anode and cathode. With respect to providing dielectric isolation between the anode and cathode junction, a high dielectric material that is capable of providing a high reverse breakdown voltage (e.g., up to 10 kV) is typically provided for the semiconductor diode. However, such dielectric materials often have an increased thickness that may be incompatible with certain POL packaging techniques for the semiconductor diode and, if the thickness is not properly controlled, can lead to increased parasitic inductance. With respect to providing a low loop inductance between the anode and cathode, challenges arise with controlling the inductance when using conventional packaging technologies. That is, inherent to conventional packaging technologies are problems associated with the high parasitic inductance of such packages, with this inductance limiting the operating frequency of the semiconductor diode, as it generates losses in the diode during commutation.

To provide dielectric isolation between the anode and cathode junction, it is thus desired that the semiconductor diode include a high dielectric material that is capable of providing a high reverse breakdown voltage, while being compatible with optimal POL packages and packaging techniques and not having a negative effect on the package inductance. To provide low loop inductance between the anode and cathode, it is desired that the POL package for the semiconductor diode be constructed so as to minimize parasitic inductance. The POL package should also provide repeatability and matching of inductances and capacitances between multiple diodes for purposes of constructing diode arrays.

Accordingly there is a need for a semiconductor diode package that provides for a high breakdown voltage in the diode as well as low parasitic inductance in the semiconductor diode package.

BRIEF DESCRIPTION OF THE INVENTION

Embodiments of the invention overcome the aforementioned drawbacks by providing a semiconductor device package structure that provides a high breakdown voltage and low parasitic inductance. Multiple passivation layers are formed about a semiconductor device, with the passivation layers having a thickness that provides a desired breakdown voltage for the semiconductor device package and that also provides a minimized parasitic inductance for the semiconductor device package.

In accordance with one aspect of the invention, a semiconductor device package includes a semiconductor device having a substrate composed of a semiconductor material and a plurality of metallic connection pads formed on the substrate, with the plurality of metallic connection pads being formed on each of first and second opposing surfaces of the semiconductor device with edges of the semiconductor device extending between the first and second surfaces. The semiconductor device package also includes a first passivation layer applied on the semiconductor device so as to cover the semiconductor device and the plurality of metallic connection pads formed on the substrate and a base dielectric laminate sheet affixed to the first surface of the semiconductor device, the base dielectric laminate sheet having a thickness greater than that of the first passivation layer. The semiconductor device package further includes a second passivation layer having a thickness greater than that of the first passivation layer that is applied over the first passivation layer and the semiconductor device so as to cover the second surface and the edges of the semiconductor device and a plurality of metal interconnects electrically coupled to the plurality of metallic connection pads of the semiconductor device, with each of the plurality of metal interconnects extending through a respective via formed through the first and second passivation layers and the base dielectric laminate sheet to form a direct metallic connection with one of the plurality of metallic connection pads.

In accordance with another aspect of the invention, a method of forming a semiconductor device package includes providing a semiconductor device having a substrate composed of a semiconductor material and a plurality of metallic connection pads formed on the substrate, with the plurality of metallic connection pads being formed on top and bottom surfaces of the semiconductor device. The method also includes applying a first passivation layer onto the top and bottom surfaces of the semiconductor device and onto edges of the semiconductor device extending between the top and bottom surfaces, adhering a base dielectric film to the bottom surface of the semiconductor device, and applying a second passivation layer over the top surface and the edges of the semiconductor device and over the first passivation layer to form a passivated semiconductor device, with the second passivation layer having a thickness greater than that of the first passivation layer. The method further includes patterning the base dielectric film and the first and second passivation layers to expose the plurality of metal interconnects and forming a plurality of metal interconnects that extend through the patterned base dielectric film and the patterned first and second passivation layers to form a direct metallic connection with the plurality of metallic connection pads.

In accordance with yet another aspect of the invention, a method of forming a semiconductor device package includes providing a semiconductor device having a substrate composed of a semiconductor material and a plurality of metallic connection pads formed on the substrate, with the plurality of metallic connection pads being formed on top and bottom surfaces of the semiconductor device. The method also includes applying a thin first passivation layer about the semiconductor device so as to passivate the top and bottom surfaces of the semiconductor device and passivate edges of the semiconductor device, applying a base dielectric laminate to the bottom surface of the semiconductor device, and applying a second passivation layer over at least the edges of the semiconductor device and over the first passivation layer to form a passivated semiconductor device, with the second passivation layer being applied so as to have a thickness that provides a desired breakdown voltage for the semiconductor device package and that also provides a minimized parasitic inductance for the semiconductor device package. The method further includes patterning the base dielectric film and the first and second passivation layers to form a plurality of vias therethrough and forming a plurality of metal interconnects that extend through the vias to form a direct metallic connection with the plurality of metal interconnects.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 2, 3, 4A, 4B, 4C, 5, 6A, 6B, 6C, and 7-13 are schematic cross-sectional side views of a semiconductor device package during various stages of a manufacturing/build-up process according to an embodiment of the invention.

FIGS. 14-17 are schematic cross-sectional side views of a semiconductor device package during various stages of a lap joint formation process according to an embodiment of the invention.

FIGS. 18-20 are schematic cross-sectional side views of an array of semiconductor device packages during various stages of an assembly process according to an embodiment of the invention.

DETAILED DESCRIPTION

Embodiments of the present invention provide for a semiconductor device package having a high breakdown voltage and low parasitic inductance, as well as a method of forming such a semiconductor device package. The semiconductor device package is manufactured such that edges of the semiconductor device are passivated using multiple dielectric layers of differing thickness, with an electrical interconnects system being formed to top and bottom surfaces of the semiconductor device.

Figure 1:
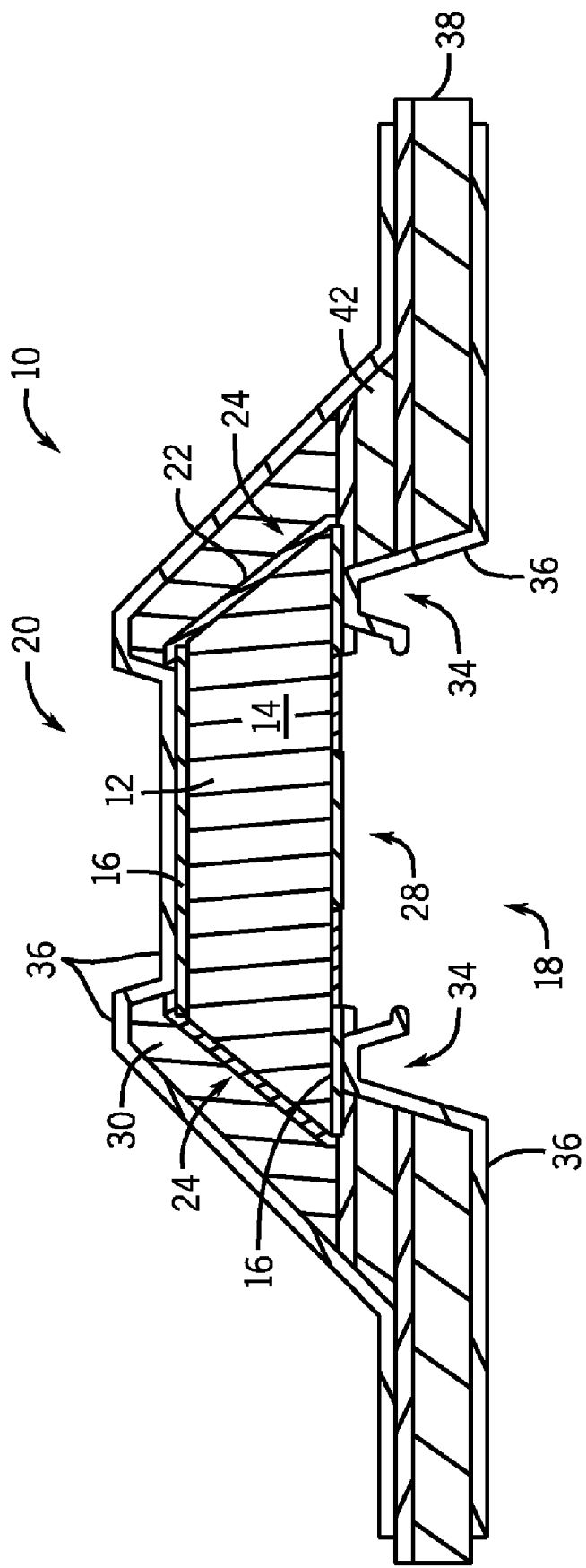
FIG. 1 is a schematic cross-sectional side view of a semiconductor device package according to an embodiment of the invention.

Referring to FIG. 1, a semiconductor device package 10 is shown according to an exemplary embodiment of the invention. The semiconductor device package 10 includes a semiconductor device 12 therein that, according to various embodiments, may be in the form of a die, diode, or other electronic device. According to an exemplary embodiment of the invention, semiconductor device 12 is in the form of a high voltage semiconductor diode, such as an optical diode having a back bias in the reverse direction, for example. As shown in FIG. 1, according to one embodiment of the invention, semiconductor device 12 may have a trapezoidal shape; however, it is recognized that other shapes and configurations for semiconductor device 12 are envisioned, such as a rectangular shape, for example. Furthermore, regarding the shape and size of semiconductor device 12, it is recognized that semiconductor device 12 is in the form of a "thicker" device, with semiconductor device 12 having a thickness/height of up to 40 mm or more, for example.

The semiconductor device 12 includes a substrate 14 formed of a semiconductor material such as silicon, silicon carbine, gallium nitride, gallium arsenide, or another semiconductor material, that has impurities added to it to create a region on one side that contains negative charge carriers (electrons), called n-type semiconductor, and a region on the other side that contains positive charge carriers (holes), called p-type semiconductor. The boundary within the substrate between these two regions, called a PN junction, is where the action of the diode takes place, with the substrate conducting conventional current in a direction from the p-type side (i.e., the anode) to the n-type side (i.e., the cathode), but not in the opposite direction. Semiconductor device 12 is termed as a "high voltage" device in that it will typically be operated at a voltage of 3 kV or greater, with voltages above 10 kV being envisioned.

Formed on the substrate, and attached to each of the P and N regions, is a plurality of metalized circuits and/or connection pads (i.e., terminals) 16 through which an electrical connection can be made to semiconductor device 12. As shown in FIG. 1, the circuits/connection pads 16 are formed on surfaces 18, 20 of substrate, such that electrical connections can be made with two surfaces of semiconductor device 12.

Also included in semiconductor device package 10 is a first passivation or dielectric layer 22 that is formed about surfaces 18, 20 and the edges 24 of the semiconductor device 12, so as to cover substrate 14 and metalized circuits/connection pads 16. First passivation layer 22 is in the form of a high performance film, such as silicon nitride, silicon oxide, or another suitable dielectric material, that is applied onto semiconductor device 12 so as to have a uniform thickness. According to one embodiment of the invention, the silicon nitride/silicon oxide passivation layer 22 is applied using plasma enhanced chemical vapor deposition (PECVD) so as to have a thickness in the order of 1-2 microns. The first passivation layer 22 thus serves to passivate the edges 24 of semiconductor device 12 as well as protect the surfaces of substrate 14 and metalized circuits/connection pads 16, such as during manufacturing processing steps of the semiconductor device package 10 (e.g., etching, lamination, etc.), as explained in detail below.

As shown in FIG. 1, portions of first passivation layer 22 are removed in locations adjacent metal circuits/connection pads 16 of semiconductor device 12, such as by using reactive ion etching (RIE), so as to provide for an electrical interconnection to made to those circuits/connection pads 16. According to an embodiment of the invention, where semiconductor device package 10 is in the form of an optically active device, the nitride or oxide passivation layer 22 is optically clear, so as to permit light to pass there through while still offering protection of an optical window 28 of the semiconductor device package 10. However, it is recognized that semiconductor device 12 may be in the form of a device/diode that is not an optically active device, and thus embodiments of the invention may not include an optical window 28, nor require use of an optically clear passivation layer.

While the first passivation layer 22 serves to serves to passivate the edges 24 of semiconductor device 12 and provide a protective covering for the metal circuits/connection pads 16 formed thereon, it is recognized that the thinness of the first passivation layer 22 (i.e., the coating of silicon nitride/oxide) is typically insufficient to hold very large voltages. As such, semiconductor device package 10 also includes a second passivation or dielectric layer 30 that is applied on top of the first passivation layer 22 and that extends out over the edges 24 of semiconductor device 12, with an adhesive layer (not shown) being optionally included there between depending on the form of the second passivation layer 30. As shown in FIG. 1, the second passivation layer 30 is applied as a thicker layer or coating of dielectric material as compared to first passivation layer 22, so as to provide a higher dielectric strength and increase the breakdown voltage of semiconductor device package 10. The thickness of second passivation layer 30 may be up to 1-2 mm, according to one embodiment of the invention.

Since the nitrides and oxides used for forming first passivation layer 22 cannot be applied much thicker than a few microns, second passivation layer 30 is formed of a different material than first passivation layer 22 but one that provides good compatibility (i.e., adhesion) to the already applied nitride/oxide film of the first passivation layer 22. Second passivation layer 30 may thus be formed of such materials as polyimides, epoxies, paralyene, silicones, etc. According to one embodiment, second passivation layer 30 is in the form of a pre-formed laminate sheet or film that is formed of Kapton®, Ultem®, polytetrafluoroethylene (PTFE), Upilex®, polysulfone materials (e.g., Udel®, Radel®), or another polymer film, such as a liquid crystal polymer (LCP) or a polyimide material. Alternatively, second passivation layer 30 can be in liquid form and applied via one of a spray coating application, a molding process, or a selective deposition process (i.e., "direct writing"), as will be explained in detail below. In either embodiment, whether second passivation layer 30 be formed of dielectric material applied in laminate form, liquid form, or a combination thereof, the second passivation layer 30 is applied over the edges 24 of the semiconductor device 12 in a controlled manner such that the thickness thereof is sufficient for a desired/required dielectric strength but yet does not excessively increase the inductive loop of the semiconductor device 12. A typical thickness of second passivation layer 30 is thus, for example, in the range of around 10-50 microns for every 1000 volts of dielectric breakdown strength needed.

As further shown in FIG. 1, according to one embodiment of the invention, a base dielectric laminate layer 42 is applied to surface 18 of semiconductor device 12, such that a thicker dielectric layer is formed entirely about the semiconductor device (i.e., combination of second passivation layer 30 and laminate 42 is formed about semiconductor device 12). Each of the first and second passivation layers 22, 30, as well as the base dielectric laminate and an additional laminate sheet of dielectric film 38 secured to base dielectric laminate 42, are selectively patterned to form a plurality of vias and/or openings 34 therein. The vias/openings 34 are formed at positions corresponding to the metalized circuits/connection pads 16 formed on semiconductor device 12, so as to expose the circuits/connection pads 16. According to one embodiment of the invention, the vias/openings 34 are formed through the first and second passivation layers 22, 30, base dielectric laminate 42, and dielectric film 38 by way of a laser ablation or laser drilling process that is performed subsequent to application of the layers 22, 30, base dielectric laminate 42, and dielectric film 38 onto semiconductor device 12. Alternatively, the vias/openings 34 may be pre-formed in second passivation layer 30 and/or dielectric laminates 42, 38 by way of a laser ablation or laser drilling process that is performed prior to application thereof onto first passivation layer 22. In an embodiment where the vias/openings 34 are pre-drilled through second passivation layer 30 and dielectric laminates 42, 38, a separate reactive ion etching (RIE) process would be performed to extend vias/openings 34 down through first passivation layer 22 to circuits/connection pads 16. According to additional embodiments of the invention, it is also recognized that vias/openings 34 may be formed by way of other methods, including plasma etching, photo-definition, or mechanical drilling processes.

Formed within each of vias/openings 34 is a metal interconnect 36 that extends down through vias/openings 34 to circuits/connection pads 16 on the semiconductor device 12. Metal interconnects 36 thus form direct metallic and electrical connections to circuits/connection pads 16, with the interconnects being formed in a tightly packed, close arrangement. Metal interconnects 36 are formed by way of applying a metal layer/material, such as via a sputtering or electroplating process, and then subsequently patterning the applied metal material into metal interconnects 36 having a desired shape. According to one embodiment, the metal interconnects 36 are formed by applying a titanium adhesion layer and copper seed layer via a sputtering process, followed by electroplating of additional copper thereon to increase a thickness of the metal interconnects 36. As shown in FIG. 1, on surface 20 of semiconductor device 12, the copper plating of metal interconnects 36 extend out from circuits/connection pads 16 of semiconductor device 12, through vias/openings 34, and out across the outer surface of second passivation layer 30 out past the edges 24 of semiconductor device 12, with the interconnects 36 in the region extending out past the edges 24 of semiconductor device 12 being formed on the additional laminate sheet of dielectric film 38 secured to base dielectric laminate 42. On surface 18 of semiconductor device 12, the copper plating of metal interconnects 36 extend out from circuits/connection pads 16 of semiconductor device 12, through vias/openings 34 formed in base dielectric laminate 42 and dielectric film 38, and out across the outer surface of dielectric film 38, with the interconnects 36 extending out past the edges 24 of semiconductor device 12 on film 38 and on a side of film 38 opposite from the interconnects 36 formed on surface 20, so as to be electrically insulated therefrom.

Beneficially, the structure of semiconductor device package 10 results in a package having a high breakdown voltage and low inductance loop. That is, the arrangement of first and second passivation layers 22, 30 and interconnects 36 can provide for a high breakdown voltage of 10 kV, with the thickness thereof being controlled so as to also decrease parasitic inductance between the anode and cathode in the semiconductor device package 10. The structure of semiconductor device package 10 allows for operation thereof at an improved/efficient operating frequency, with reduced switching time and improved signal strength for subsequent signal transmission (e.g., generation of a square wave pulse for Fourier processing).

Referring to FIGS. 2-10, various process steps for techniques of manufacturing semiconductor device package 10 are set forth, according to embodiments of the invention. As shown in FIG. 2, the build-up process of semiconductor device package 10 begins with application of a first passivation or dielectric layer 22 on semiconductor device 12. The first passivation layer 22 is formed about surfaces 18, 20 and edges 24 of the semiconductor device 12, so as to cover the substrate 14 and metalized circuits/connection pads 16 of the semiconductor device. First passivation layer 22 is in the form of a high performance film, such as silicon nitride or silicon oxide, that is applied onto semiconductor device 12 so as to have a uniform thickness. According to one embodiment of the invention, the silicon nitride/silicon oxide passivation layer 22 is applied using plasma enhanced chemical vapor deposition (PECVD) so as to have a thickness in the order of 1-2 microns. The first passivation layer 22 thus serves to passivate the edges 24 of semiconductor device 12 as well as protect the surfaces 18, 20 of substrate 14 and metalized circuits/connection pads 16.

Referring now to FIG. 3, in a next step of the build-up process, the semiconductor device 12, with the first passivation layer 22 applied thereto, is placed into an adhesive layer 40 and accompanying base dielectric layer 42 that is in the form of a lamination/film. As shown in FIG. 3, semiconductor device 12 is placed onto adhesive layer 40 and dielectric lamination 42 such that surface 18 thereof is secured to the layers 40, 42, with the surface 20 of semiconductor device 12 remaining open. According to embodiment of the invention, the dielectric layer 42 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material. Upon placement of semiconductor device 12 onto adhesive layer 40 and base dielectric lamination 42, the adhesive 40 is cured to secure the semiconductor device 12 on the dielectric lamination 42.

The build-up process continues with application of another dielectric or passivation layer (i.e., second passivation layer) onto surface 20 and edges 24 of semiconductor device 12. According to embodiments of the invention, and as shown and described below in FIGS. 4-7, it is recognized that such a dielectric layer may be applied according to one of several application processes, such as by way of application of a pre-formed laminate sheet or film layer of dielectric material or by way of application of a liquid dielectric material via a spray coating application, a molding process, or a selective deposition process (i.e., "direct writing").

Figure 4A:
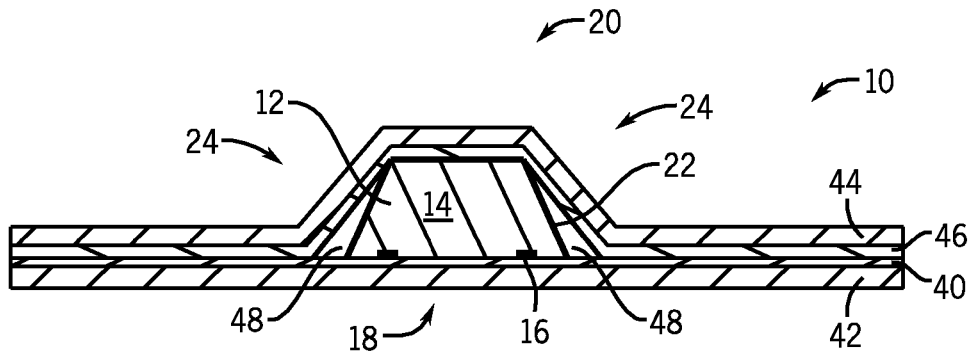
Figure 4B:
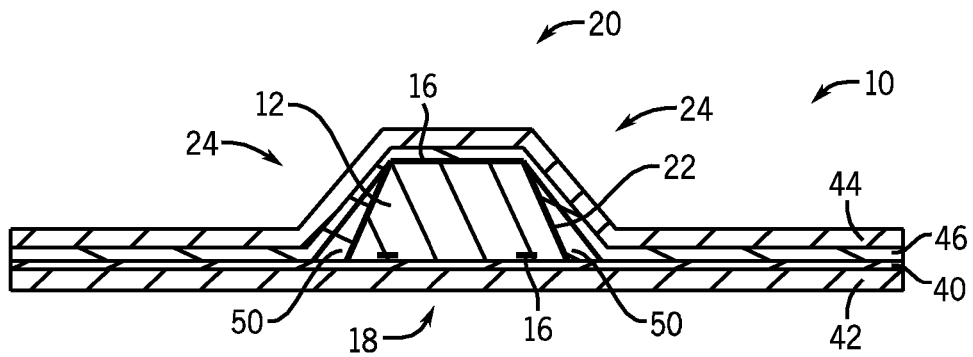
Figure 4C:
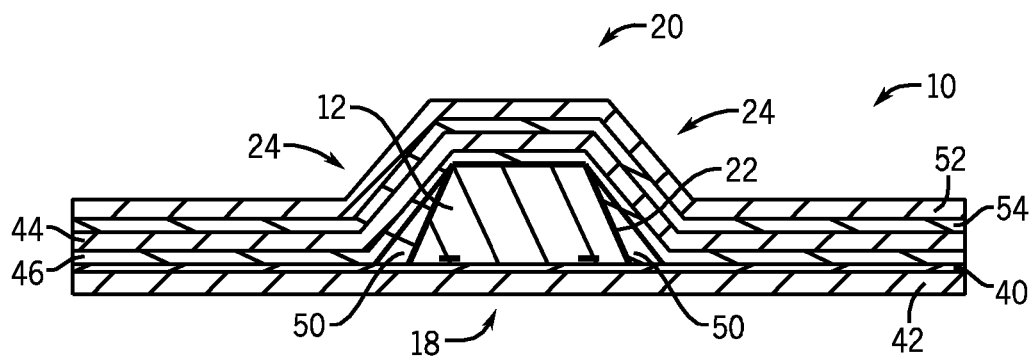

Referring to FIGS. 4A-4C, according to one embodiment of the invention, a laminate sheet of dielectric material 44 is applied over surface 20 and edges 24 of semiconductor device 12, with an adhesive layer 46 (e.g., B-staged, tacky adhesive) included therebetween to secure the sheet of dielectric material 44 to semiconductor device 12. As shown in FIG. 4A, the thickness of dielectric sheet 44 is greater than that of first passivation layer 22, with the thickness of dielectric sheet 44 being determined and controlled based on the dielectric breakdown strength needed for semiconductor device 12. In general, the thickness of dielectric sheet 44 will be in the range of around 10-50 microns for every 1 kV of dielectric breakdown strength needed.

As shown in FIG. 4A, when a laminate sheet of dielectric material 44 is applied over surface 20 and edges 24 of semiconductor device 12, a void 48 may be left adjacent the edges 24 of semiconductor device 12, which is termed "tenting." This void 48 is filled in a next step of the build-up process, as shown in FIG. 4B, with an epoxy or polyimide material 50 that is subsequently cured. According to one embodiment, the void 48 is filled from one end with the epoxy/polyimide 50, with a vent hole (not shown) being provided at the other end to let out air. It is recognized that if no tenting is seen, then the step illustrated at FIG. 4B would not be needed.

Referring now to FIG. 4C, according to one embodiment of the invention, additional laminate sheets of dielectric material 52 may be applied over surface 20 and edges 24 of semiconductor device 12 depending on the electrical requirements of semiconductor device package 10 (i.e., to further increase the dielectric strength). Thus, one additional sheet of dielectric material 52 may be positioned on top of the dielectric sheet 44 with an adhesive layer 54 included therebetween to secure the sheets 44, 52 together. While not shown in FIG. 4C, yet still additional sheets may be added over surface 20 of semiconductor device 12 as needed.

While the dielectric laminations 44, 52 shown in FIGS. 4A-4C are formed as continuous laminations, it is recognized that pre-patterned laminations may alternatively be applied, according to another embodiment of the invention. That is, dielectric laminations 44, 52 may have vias and/or additional openings (not shown) pre-drilled or ablated therein before laminating onto the semiconductor device 12. These vias and/or openings would be formed in locations corresponding to circuits/connection pads 16 on semiconductor device 12.

Figure 5:
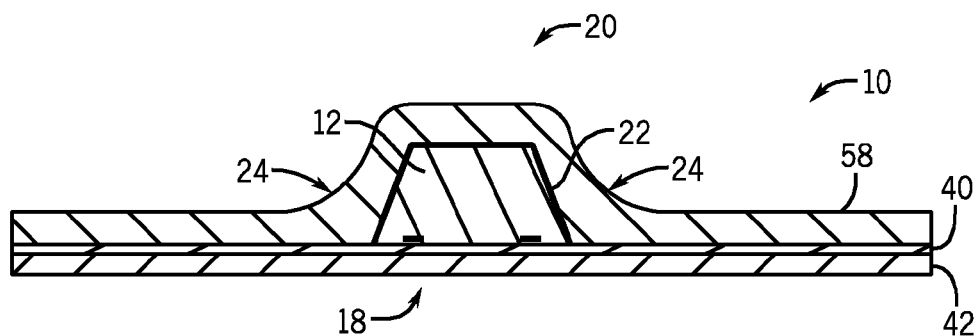

Referring now to FIG. 5, according to another embodiment of the invention, a liquid dielectric material is applied over surface 20 and edges 24 of semiconductor device 12 via a spray coating application. The liquid dielectric material is sprayed onto semiconductor device 12 such that a dielectric layer 58 is formed having a thickness greater than that of first passivation layer 22, with the thickness of dielectric layer 58 being determined and controlled based on the dielectric breakdown strength needed for semiconductor device 12. As set forth above, the thickness of dielectric layer 58 will be in the range of around 10-50 microns for every 1 kV of dielectric breakdown strength needed. Depending on the desired thickness and geometry of the dielectric layer 58, multiple spray coating steps may need to be performed.

Figure 6A:
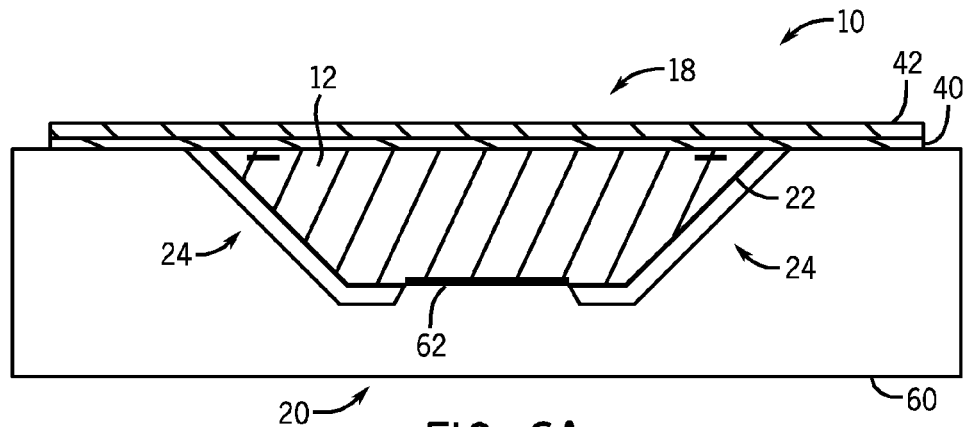
Figure 6B:
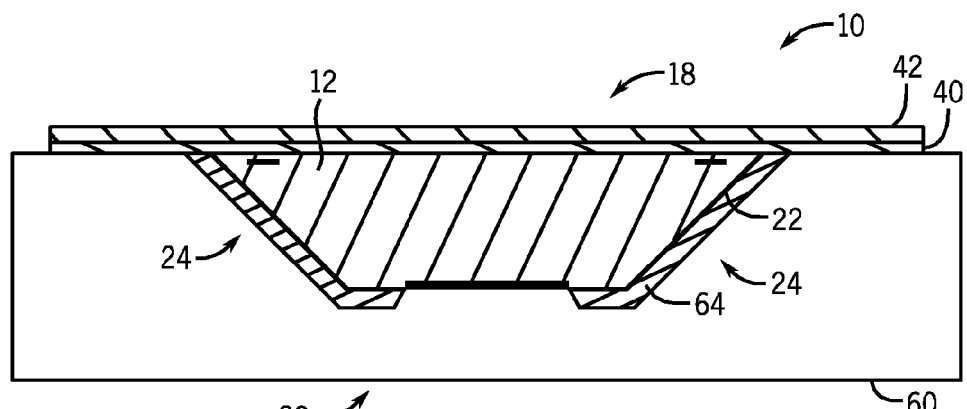
Figure 6C:
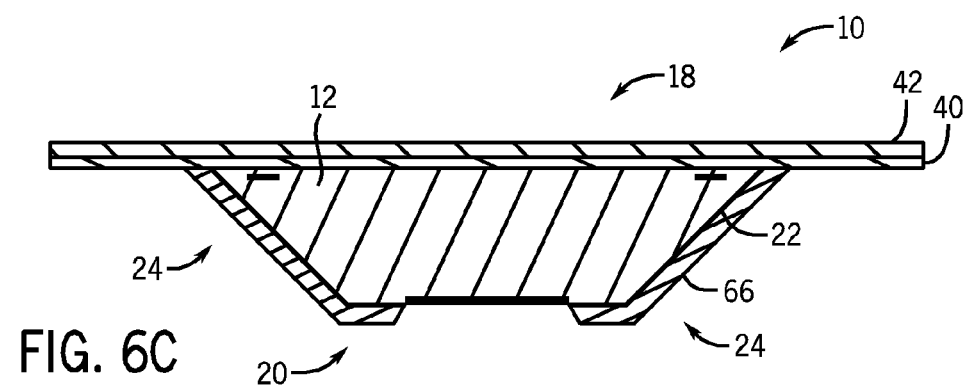

Referring now to FIGS. 6A-6C, according to another embodiment of the invention, a liquid dielectric material is applied over surface 20 and edges 24 of semiconductor device 12 using a mold to control a shape and thickness of a resulting dielectric layer. As shown in FIG. 6A, semiconductor device 12 and the adhered base dielectric layer 42 are flipped over such that semiconductor device 12 is pointed downward. The semiconductor device 12 is then placed into a mold 60 positioned therebelow, with the semiconductor device 12 being held in place within mold 60 by, for example, a protrusion 62 formed in the center of mold 60, and such that a space is formed between the semiconductor device 12 and the mold 60. Exact positioning of the semiconductor device 12 within mold 60 may be provided by a pin align mechanism (not shown), for example. In a next step, and as shown in FIG. 6B, the mold 60 is filled with a liquid dielectric material 64, such as an epoxy or polyimide for example, with the liquid being injected through a fill port (not shown) provided in the mold and into the space between the semiconductor device 12 and the mold 60. A vent port (not shown) is also provided in the mold to enable injection of the dielectric material 64. Upon filling of the mold 60 with the liquid dielectric material 64, the dielectric is cured and the mold removed, as shown in FIG. 6C, to form a finished dielectric layer 66 over the surface 20 and edges 24 of semiconductor device 12. As mold 60 is constructed of Teflon® or a similar material, the dielectric layer 64 should not stick to the mold 60 when removing semiconductor device 12 therefrom.

Figure 7:
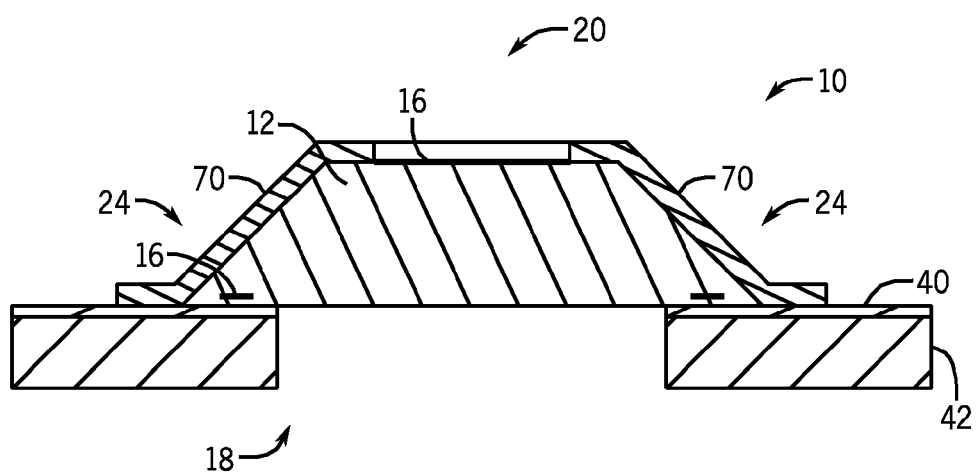

Referring now to FIG. 7, according to still another embodiment of the invention, a liquid dielectric material is applied over surface 20 and edges 24 of semiconductor device 12 by way of a selective deposition process, or a "direct write" process. In direct writing of the dielectric material onto the semiconductor device 12, the dielectric material is dispensed using a programmable dispensing tool (not shown) that deposits lines or dots 70 of the dielectric material in liquid form. For example, the programmable dispensing tool may be in the form of an inkjet printing-type device that selectively deposits lines or dots 70 of the dielectric material in liquid form. The lines/dots 70 are drawn to obtain the necessary coverage of the semiconductor device 12 and can be applied in multiple layers to obtain the necessary geometry and thickness for the dielectric material. The applied lines/dots 70 of dielectric material are then cured to complete the passivation.

Figure 8:
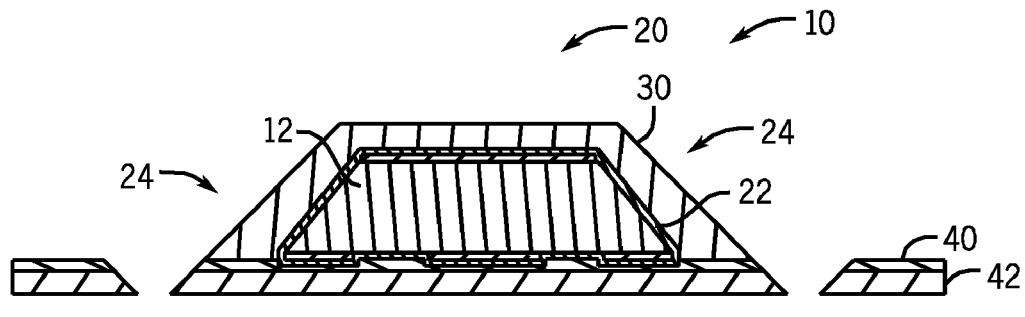

Referring now to FIG. 8, upon application of the second dielectric or passivation layer (generally designated henceforth as 30) over surface 20 and edges 24 of semiconductor device 12 via one of the techniques shown and described in the embodiments of FIGS. 4-7, the build-up process of semiconductor device package 10 may continue with an ablation of the second passivation layer 30. That is, it is recognized that in some cases the exact desired geometry/thickness of the second passivation layer 30 may not be obtained and slight modifications to the profile may need to be performed. One method that is used is laser ablation, or a similar method, to ablate away excess material to obtain the necessary profile of the passivation layer 30. As shown in FIG. 8, the passivation layer 30 is shown as having a trapezoidal shape so as to match the trapezoidal shape of semiconductor device 12; however, it is recognized that other shapes and configurations for both passivation layer 30 and semiconductor device 12 are envisioned, such as a rectangular shape, for example. The modification of the thickness and/or geometry of second passivation layer 30 using laser ablation or another method can be performed for any of the dielectric material application methods set forth above, including the laminate application (FIGS. 4A-4C), spray coating application (FIG. 5), molding application (FIGS. 6A-6C), or direct writing application (FIG. 7). If, however, the desired geometry of the second passivation layer 30 is obtained upon an initial application of the dielectric material onto semiconductor device 12, such as may be envisioned especially using the molding application or direct writing application, it is recognized that ablating of the second passivation layer 30 to alter the thickness and geometry thereof may be forgone.

As further shown in FIG. 8, the semiconductor device 12 is "trimmed" such that a portion of any dielectric laminations (and accompanying adhesive layers) extending out past a desired profile of second passivation layer 30 along edges 24 of the semiconductor device 12 is removed. According to the embodiment of the invention shown in FIG. 8, a portion of base dielectric lamination 42 and adhesive layer 40 are trimmed from semiconductor device 12, such as by way of a laser ablation, for example. It is recognized, however, that additional dielectric laminations extending out past a desired profile of second passivation layer 30 along edges 24 of the semiconductor device 12 could also be trimmed, such as dielectric lamination 52 (and adhesive layer 56) shown in FIG. 4C, for example. Similar to the removal of any excess material from the dielectric material formed about surface 20 and edges 24 of semiconductor device 12, the trimming of any dielectric laminations 42 extending out past a desired profile of second passivation layer 30 along edges 24 of the semiconductor device 12 may be performed so as achieve a desired shape of the remaining portion of dielectric layer 42 attached to semiconductor device 12. Thus, in the embodiment of FIG. 8, the trimming of semiconductor device 12 out from base dielectric lamination 42 is performed at an angle so as to maintain an overall trapezoidal shape of the second passivation layer 30 about semiconductor device 12.

Figure 9:
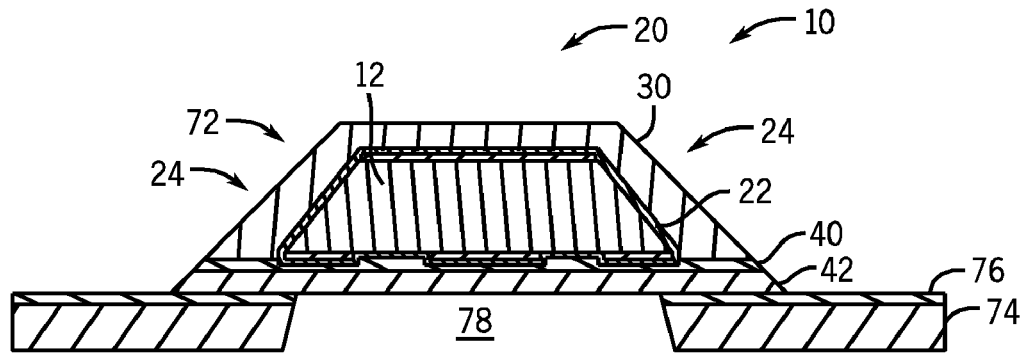

Referring now to FIG. 9, upon shaping of second passivation layer 30 and trimming of the semiconductor device 12 out from base dielectric layer 42, a passivated semiconductor device 72 is thus formed. The passivated semiconductor device 72 is subsequently attached to a dielectric sheet (e.g., polyimide sheet) 74 via an adhesive layer 76. As shown in FIG. 9, dielectric sheet 74 includes a window 78 opening pre-cut therein that generally corresponds in size to semiconductor device 12. It is recognized, however, that dielectric sheet 74 could also be in the form of a continuous sheet (i.e., no window pre-cut therein), and that a window could subsequently be formed therein after placement of passivated semiconductor device 72 on the dielectric sheet 74.

Upon securing passivated semiconductor device 72 to dielectric sheet 74, the build-up process of semiconductor device package 10 continues with the patterning and interconnection steps illustrated in FIGS. 10-13. With regard to these build-up steps, it is recognized that the technique used to apply second passivation layer 30 over surface 20 and edges 24 of semiconductor device 12 will determine the exact steps required regarding patterning the passivation layer 30 and making electrical interconnections to the top and bottom of the semiconductor device 12. Such variations in the exact build-up process steps employed in the patterning and interconnecting steps are addressed below.

Figure 10:
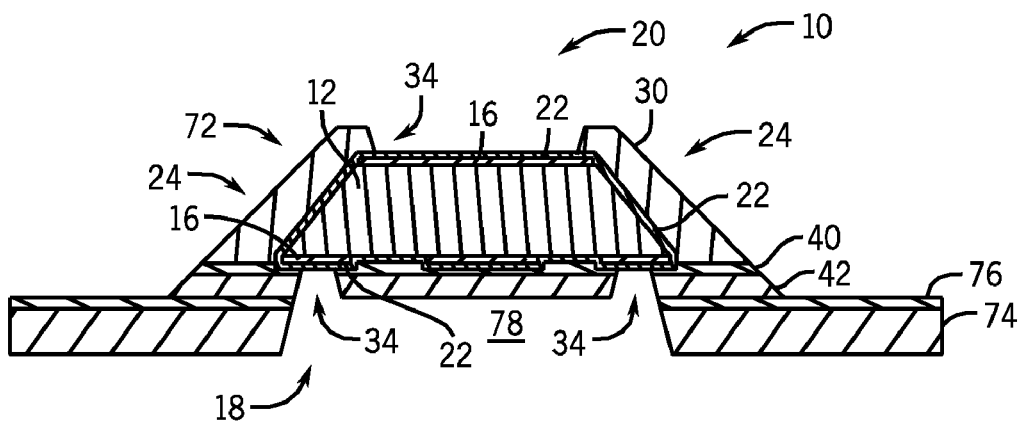

Referring to FIG. 10, according to one embodiment of the invention, vias and contact areas (i.e., openings) 34 are formed in first and second passivation layers 22, 30 so as to provide access to circuits/connection pads 16 of semiconductor device 12. The vias/openings 34 are formed at positions corresponding to circuits/connection pads 16 on semiconductor device 12, with the vias/openings 34 being formed down to the first passivation layer 22 formed over those circuits/connection pads 16. According to embodiments of the invention, the vias/openings 34 may be formed by way of a laser ablation or laser drilling process, plasma etching, photo-definition, or mechanical drilling processes. In an embodiment of the invention where second passivation layer 30 is applied in the form of one or more dielectric laminations/sheets, such as sheets 44, 52 shown in FIGS. 4A-4C, vias/openings 34 may be mechanically drilled through the dielectric layer(s) and adhesive layer(s) applied over semiconductor device 12. In an embodiment of the invention where the second passivation layer 30 is applied via spray coating, direct writing, or molding, such as in FIGS. 5-7, vias/openings 34 may be formed in the passivation layer 30 in the regions that require interconnection to the device 12 using a laser ablation or laser drilling. It is recognized, however, that certain methods of applying second passivation layer 30 may negate the need for subsequent ablating or drilling of vias/opening 34 therein. For example, for application of dielectric material employing a mold or direct writing technique, one or more vias/openings 34 may already be formed in second passivation layer 30.

Figure 11:
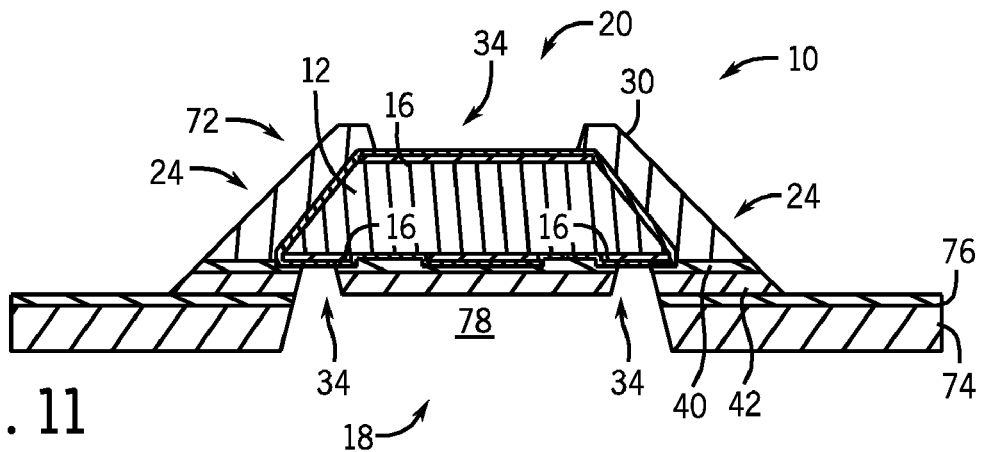

In a next step of the patterning/interconnect process, and as shown in FIG. 11, the vias/opening 34 are further extended down to the circuits/connection pads 16 on semiconductor device 12 by removing the first passivation layer 22 that is present over the circuits/connection pads 16 at the locations corresponding to vias/opening 34. According to one embodiment of the invention, first passivation layer 22 adjacent metal circuits and connection pads 16 of semiconductor device 12 is removed by way of a reactive ion etching (RIE) process, although it is envisioned that other suitable techniques may also be employed. Upon extending of vias/opening 34 by way of removing of first passivation layer 22, the circuits/connection pads 16 of semiconductor device 12 are exposed so as to provide for an electrical interconnection to be made to those circuits/connection pads.

Figure 12:
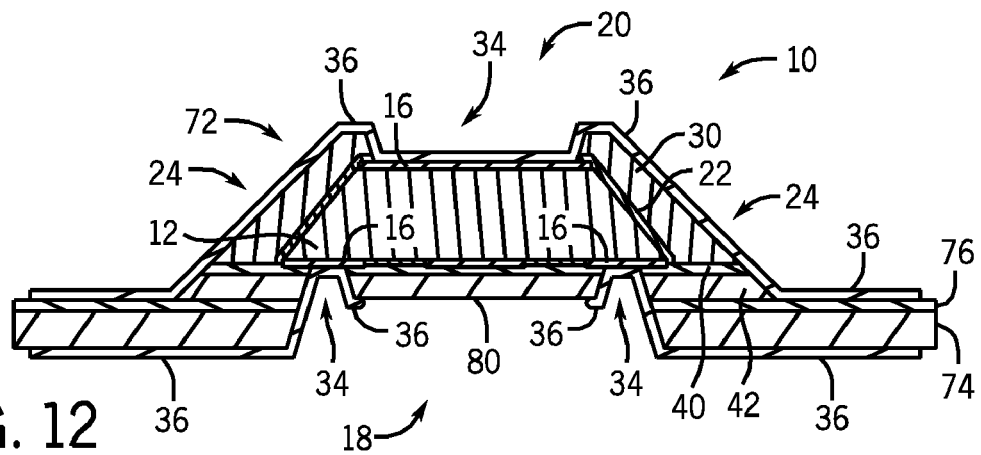

Upon completion of the formation of vias/opening 34 down to circuits/connection pads 16, the vias/opening 34 are cleaned (such as through an RIE desoot process) and subsequently metalized to form interconnects 36, as shown in FIG. 12. The metal interconnects 36 are typically formed through a combination of sputtering and electroplating applications. For example, a titanium adhesion layer and copper seed layer may first be applied via a sputtering process, followed by an electroplating process that increases a thickness of the copper to a desired level. The applied metal material is then subsequently patterned into metal interconnects 36 having a desired shape. As shown in FIG. 12, metal interconnects 36 form direct metallic and electrical connections to circuits/connection pads 16 on semiconductor device 12. The metal interconnects 36 extend out from circuits and/or connection pads 16 of semiconductor device 12, through vias/opening 34, and out across opposing surfaces 18, of semiconductor device 12. The metal interconnects 36 further extend out past the edges 24 of semiconductor device 12 on opposing surfaces of dielectric sheet 74, such as in the form of copper plating on the dielectric sheet 74.

Figure 13:
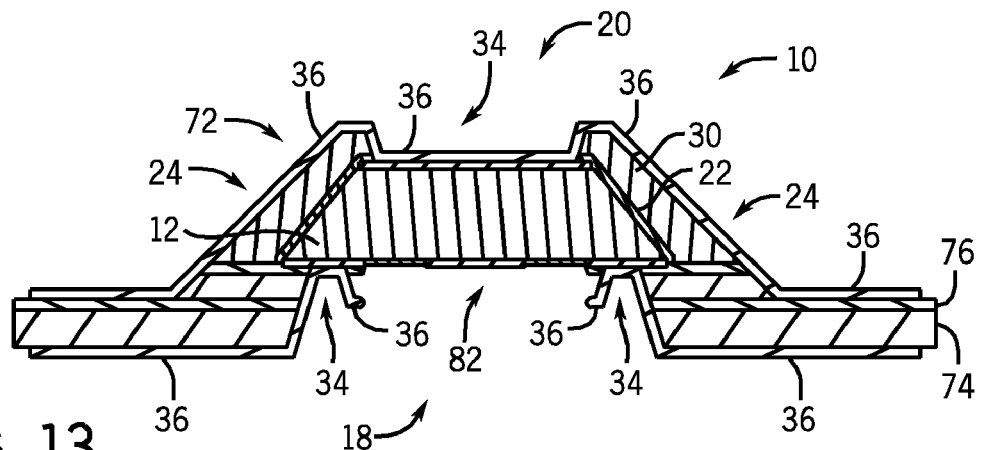

According to an embodiment of the invention where semiconductor device 12 is in the form of an optical diode (i.e., diode with light-based switching), a further patterning step is performed to remove an additional portion 80 of base dielectric layer 42. As shown in FIG. 13, portion 80 of base dielectric sheet 42 and adhesive layer 40 are ablated off of surface 18 of passivated semiconductor device 72, with a metal circuit/contact 16 serving as a backstop or mask for the ablating. An open window 82 is thus formed on surface 18 of passivated semiconductor device 72 that allows light to reach the optical diode 12. In such an embodiment, it is recognized that first passivation layer 22 would be composed of an optically clear and anti-reflective material that permits light to pass there through, while still offering protection of optical window 82 of the semiconductor device package 10.

According to another embodiment of the invention, it is recognized that, in certain applications of semiconductor device package 10, it may be desirable to employ an array of such semiconductor device packages 10 arranged in parallel and/or in series. As such, an efficient technique for assembling an array of semiconductor device packages 10 is highly desired. Referring now to FIGS. 14-17, according to one embodiment of the invention, a lap joint is formed on semiconductor device package 10 in order to accommodate assembling/joining an array of such packages.

As shown in FIG. 14, upon completion of patterning and interconnecting semiconductor device packages 10, dielectric sheet 74 and adhesive layer 76 are ablated away on opposing sides of semiconductor device 12 at areas 84 where lap joints are desired to be formed. As shown in FIG. 14, the ablation is performed in an area of dielectric sheet 74 which is free of metal interconnects (e.g., copper plating) 36 thereon. After ablation of dielectric sheet 74 and adhesive layer 76, an additional adhesive layer 86 and dielectric sheet 88 are applied/laminated over surface 20 of passivated semiconductor device 72, with adhesive layer 86 and dielectric sheet 88 extending out past the lap joint area 84, as is seen in FIG. 15. In a next step of the lap joint formation process, and as shown in FIG. 16, the additionally applied adhesive layer 86 is ablated in the lap joint area 84, such that only dielectric sheet 88 is left in the lap joint area 84. The remaining portions of dielectric sheet 74 and adhesive layer 76 and of dielectric sheet 88 and adhesive layer 86 that are outside of the lap joint area 84 (i.e., distal from semiconductor device 12) are then removed in a final ablation step shown in FIG. 17, such that a completed semiconductor device package 10 having a defined lap joint 90 thereon is singulated out of the dielectric sheet 88 that was added.

The formation of lap joint 90 in the completed semiconductor device package 10 allows for easy joining of the device package to another identical device package, such that an array of semiconductor device packages 10 can be easily formed. Referring now to FIGS. 18-20, an assembly process for assembling an array of semiconductor device packages by way of lap joints 90 is shown. As shown in FIG. 18, in a first step of the assembly process, an adhesive film or liquid 92 is deposited on dielectric sheet 88 on the lap joint 90. In a next step of the assembly process, and as shown in FIG. 19, one or more additional semiconductor device packages 94 are then aligned with semiconductor device package 10, such as by way of a pin alignment system (not shown) or similar alignment tool. According to one embodiment of the invention, a lamination press (not shown) is then employed to heat up the adhesive 92 on the lap joint 90, to provide for adhering of semiconductor device package 10 to the additional semiconductor device packages 94. More specifically, adhesive 92 secures the dielectric sheet 88 of semiconductor device package 10 to the dielectric sheet(s) 88 of semiconductor device packages 94.

While adhesive 92 provides a mechanical-type bond between semiconductor device package 10 and semiconductor device packages 94, a mechanism is still required for forming an electrical connection between the device packages. Thus, as shown in FIG. 20, an electrically conductive material/component 96 is provided on edges of semiconductor device package 10 and extending over to semiconductor device packages 94. For example, a metal strip, solder, or other conductive material (e.g., conductive adhesive) is provided between the semiconductor device packages 10, 94. The solder 96, for example, is applied on interconnects (e.g., copper plating) 36 formed on opposing sides of the semiconductor device package 10, that being on outward facing surfaces of dielectric sheet 74 and dielectric sheet 88. The solder 96 is thus mechanically and electrically coupled directly to the interconnects 36 of the adjacent semiconductor device packages 10, 94 so as to provide an electrical connection therebetween.

With respect to providing an array of semiconductor device packages 10, 94, it is recognized that the build-up technique for individually constructing each semiconductor device package 10 (as shown in FIGS. 2-12) is a highly repeatable process that results in matched inductances, capacitances, and resistances in each semiconductor device package in the array of semiconductor device packages 10, 94. The matching of inductances, capacitances, and resistances between each semiconductor device package in the array of semiconductor device packages 10, 94 beneficially results in an array having improved operating performance.

Therefore, according to one embodiment of the invention, a semiconductor device package includes a semiconductor device having a substrate composed of a semiconductor material and a plurality of metallic connection pads formed on the substrate, with the plurality of metallic connection pads being formed on each of first and second opposing surfaces of the semiconductor device with edges of the semiconductor device extending between the first and second surfaces. The semiconductor device package also includes a first passivation layer applied on the semiconductor device so as to cover the semiconductor device and the plurality of metallic connection pads formed on the substrate and a base dielectric laminate sheet affixed to the first surface of the semiconductor device, the base dielectric laminate sheet having a thickness greater than that of the first passivation layer. The semiconductor device package further includes a second passivation layer having a thickness greater than that of the first passivation layer that is applied over the first passivation layer and the semiconductor device so as to cover the second surface and the edges of the semiconductor device and a plurality of metal interconnects electrically coupled to the plurality of metallic connection pads of the semiconductor device, with each of the plurality of metal interconnects extending through a respective via formed through the first and second passivation layers and the base dielectric laminate sheet to form a direct metallic connection with one of the plurality of metallic connection pads.

According to another embodiment of the invention, a method of forming a semiconductor device package includes providing a semiconductor device having a substrate composed of a semiconductor material and a plurality of metallic connection pads formed on the substrate, with the plurality of metallic connection pads being formed on top and bottom surfaces of the semiconductor device. The method also includes applying a first passivation layer onto the top and bottom surfaces of the semiconductor device and onto edges of the semiconductor device extending between the top and bottom surfaces, adhering a base dielectric film to the bottom surface of the semiconductor device, and applying a second passivation layer over the top surface and the edges of the semiconductor device and over the first passivation layer to form a passivated semiconductor device, with the second passivation layer having a thickness greater than that of the first passivation layer. The method further includes patterning the base dielectric film and the first and second passivation layers to expose the plurality of metal interconnects and forming a plurality of metal interconnects that extend through the patterned base dielectric film and the patterned first and second passivation layers to form a direct metallic connection with the plurality of metallic connection pads.

According to yet another embodiment of the invention, a method of forming a semiconductor device package includes providing a semiconductor device having a substrate composed of a semiconductor material and a plurality of metallic connection pads formed on the substrate, with the plurality of metallic connection pads being formed on top and bottom surfaces of the semiconductor device. The method also includes applying a thin first passivation layer about the semiconductor device so as to passivate the top and bottom surfaces of the semiconductor device and passivate edges of the semiconductor device, applying a base dielectric laminate to the bottom surface of the semiconductor device, and applying a second passivation layer over at least the edges of the semiconductor device and over the first passivation layer to form a passivated semiconductor device, with the second passivation layer being applied so as to have a thickness that provides a desired breakdown voltage for the semiconductor device package and that also provides a minimized parasitic inductance for the semiconductor device package. The method further includes patterning the base dielectric film and the first and second passivation layers to form a plurality of vias therethrough and forming a plurality of metal interconnects that extend through the vias to form a direct metallic connection with the plurality of metal interconnects.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A semiconductor device package comprising:
    a semiconductor device including a substrate composed of a semiconductor material and a plurality of metallic connection pads formed on the substrate, the plurality of metallic connection pads being formed on each of first and second opposing surfaces of the substrate with edges of the semiconductor device extending between the first and second surfaces;
    a first passivation layer applied on the semiconductor device, the first passivation layer being applied so as to cover the semiconductor device including the plurality of metallic connection pads formed on the substrate;
    a base dielectric laminate sheet affixed to the first surface of the semiconductor device, the base dielectric laminate sheet having a thickness greater than that of the first passivation layer;
    a second passivation layer applied over the first passivation layer and the semiconductor device and having a thickness greater than that of the first passivation layer, with the second passivation layer covering the second surface and the edges of the semiconductor device; and
    a plurality of metal interconnects electrically coupled to the plurality of metallic connection pads of the semiconductor device, each of the plurality of metal interconnects extending through a respective via formed through the first and second passivation layers or through the base dielectric laminate sheet to form a direct metallic connection with one of the plurality of metallic connection pads.

2. The semiconductor device package of claim 1 wherein the first passivation layer comprises one of silicon nitride and silicon oxide.

3. The semiconductor device package of claim 1 wherein the second passivation layer comprises at least one dielectric laminate sheet applied over the first passivation layer and the second surface and edges of the semiconductor device, with the at least one dielectric laminate sheet being formed to substantially match a shape of the semiconductor device.

4. The semiconductor device package of claim 3 further comprising an adhesive layer positioned between the first passivation layer and the second passivation layer.

5. The semiconductor device package of claim 1 wherein the second passivation layer comprises a liquid dielectric material applied over the first passivation layer and the second surface and edges of the semiconductor device semiconductor device so as to substantially match a shape of the semiconductor device, the liquid dielectric material being applied via one of a spray application, a molding application, and a selective deposition application.

6. The semiconductor device package of claim 1 further comprising an additional dielectric laminate sheet affixed to the base dielectric laminate sheet semiconductor device and extending out past a perimeter of the semiconductor device.

7. The semiconductor device package of claim 6 wherein the plurality of metal interconnects extends out past the perimeter of the semiconductor device and onto the additional dielectric laminate sheet.

8. The semiconductor device package of claim 6 further comprising a lap joint formed on the additional dielectric laminate sheet extending out past the perimeter of the semiconductor device, wherein the lap joint is configured to couple the semiconductor device package with another semiconductor device package.

9. The semiconductor device package of claim 1 wherein the semiconductor device comprises an optical diode.

10. The semiconductor device package of claim 9 further comprising an optical window formed through one of the base dielectric laminate sheet and the second passivation layer so as to expose one surface of the optical diode.

11. The semiconductor device package of claim 1 wherein the second passivation layer is configured to have a thickness that provides a desired breakdown voltage for the semiconductor device package and that also provides a minimized parasitic inductance for the semiconductor device package.

* * * * *